(12) United States Patent
Kothandaraman et al.

(10) Patent No.: US 6,781,436 B2
(45) Date of Patent: Aug. 24, 2004

(54) PROGRAMMING TRANSISTOR IN BREAKDOWN MODE WITH CURRENT COMPLIANCE

(75) Inventors: Chandrasekharan Kothandaraman, Bogota, NJ (US); S. Sundar Kumar Iyer, Beacon, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/202,943

(22) Filed: Jul. 25, 2002

(65) Prior Publication Data

US 2004/0017246 A1 Jan. 29, 2004

(51) Int. Cl.[7] .......................... H01H 37/76; H01H 85/00
(52) U.S. Cl. ...................................... 327/525; 327/526
(58) Field of Search ................................. 327/525, 526; 365/225.7

(56) References Cited

U.S. PATENT DOCUMENTS 5,208,780 A * 5/1993 Iwase et al. ............. 365/225.7
5,257,222 A 10/1993 Lee ............................. 365/96
6,545,928 B1 * 4/2003 Bell ......................... 365/225.7

* cited by examiner

*Primary Examiner*—Quan Tra
(74) *Attorney, Agent, or Firm*—Brinks Hofer Gilson & Lione

(57) ABSTRACT

A transistor (such as a MOSFET) is operated in its breakdown region, as opposed to its saturation region, to program an electric fuse. With the programming transistor operated in the breakdown region, a much higher current is enabled than the associated saturation current for the same size transistor. Thus, a smaller transistor can be used for programming the fuse. Cooperative with transistor operation in the breakdown region, a dynamic current compliance device is used to limit the peak current to prevent damage than can result from excessive current flowing through the transistor. The current compliance device can be external to the integrated fuse and programming transistor circuit.

16 Claims, 2 Drawing Sheets

US 6,781,436 B2

PROGRAMMING TRANSISTOR IN BREAKDOWN MODE WITH CURRENT COMPLIANCE

BACKGROUND OF THE INVENTION

1. Technical Field of the Invention

The present invention relates generally to the field of semiconductor devices and, more particularly, to electric fuse programming devices.

2. Description of Related Art

In integrated circuits, including CMOS integrated circuits, it is often desirable to be able to permanently store information, or to form permanent connections of the integrated circuit after it is manufactured. Fuses or devices forming fusible links are frequently used for this purpose. Fuses can be programmed to replace defective elements with redundant elements, for example. Further, fuses can be used to store die identification or other such information, or to adjust the speed of a circuit by adjusting the resistance of the current path.

For conventional programming of electrical fuses, a large current is passed through the fuse via a coupled transistor (programming transistor). Thus, the programming transistor must have the capacity to carry the current required to program the fuse. In order to achieve that capacity, the width of the programming transistor is appropriately chosen. For polysilicide fuses, the peak current required for programming can be of the order of 10 mA or more. This order of current requires a wide transistor acting as the programming transistor, hence, the area required for implementation can be significant even if the individual fuse element itself is small.

A conventional circuit for programming a fuse is shown in FIG. 1 in which the fuse 11 is connected between the drain of the programming transistor 13 and a supply voltage $V_{DD}$. Initially, the resistance of the fuse 11 is small (typically in the range of 100 ohms). The fuse 11 is programmed by switching ON the programming transistor 13 with a pulse 15 applied to the gate. When the transistor 13 is turned ON, the transistor 13 starts to conduct and current flows through the fuse 11. The current flow causes the fuse 11 to be heated-up and, if sufficient current continues to flow through it, it becomes programmed by melting, electromigration or other mechanisms, resulting in a much higher resistance (i.e. programmed resistance).

In order to ensure that sufficient current flows through the fuse 11 for programming, the supply voltage must be sufficiently high and the transistor 13 in saturation (which is the conventional design) for carrying the programming current at the applied gate voltage. Since the programming current can be quite large (10 mA or more), the size of the programming transistor 13 becomes quite large (40 micron by 0.4 micron for gate oxide thickness of 6.5 nm), costing precious area on the silicon wafer.

Exacerbating the problem is the fact that most integrated chips include multiple fuses and programming transistors such as the conventional multiple fuse circuit shown in FIG. 2. In DRAM chips, for example, a few thousand fuses are generally used. For transistors conventionally operated in the saturation region, the large size combined with the large number of transistors can be quite costly because of the silicon wafer area consumed. Hence, it is desirable to find ways to minimize the silicon area being used for fuse implementation while also ensuring reliable fuse programming.

SUMMARY OF THE INVENTION

The present invention achieves technical advantages as an apparatus and method of programming an electrical fuse using a transistor (such as a MOSFET) which is operated in its breakdown region as opposed to its saturation region. With the programming transistor operated in the breakdown region, a much higher current is enabled than the associated saturation current for the same size transistor. Thus, a smaller transistor can be used for programming the fuse. Cooperative with transistor operation in the breakdown region, a dynamic current compliance device is used to limit the peak current to prevent damage that can result from excessive current flow through the transistor.

BRIEF DESCRIPTION OF THE DRAWINGS

For a more complete understanding of the present invention, reference is made to the following detailed description taken in conjunction with the accompanying drawings wherein:

FIG. 5 shows a graphical representation of transistor characteristics with the gate turned OFF and the gate turned ON.

DETAILED DESCRIPTION

Figure 1:
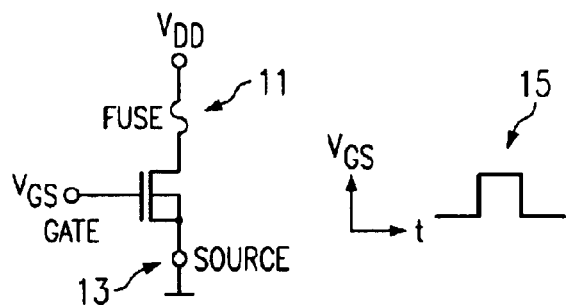
FIG. 1 illustrates a conventional circuit for programming a fuse.
Figure 2:
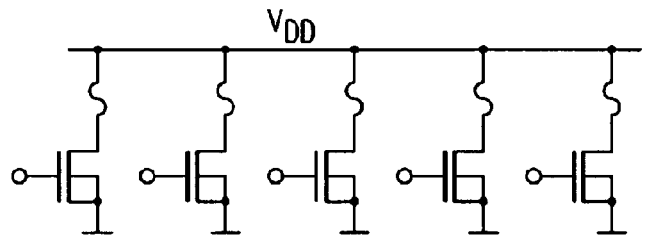
FIG. 2 illustrates a conventional circuit for programming multiple fuses.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Figure 3:
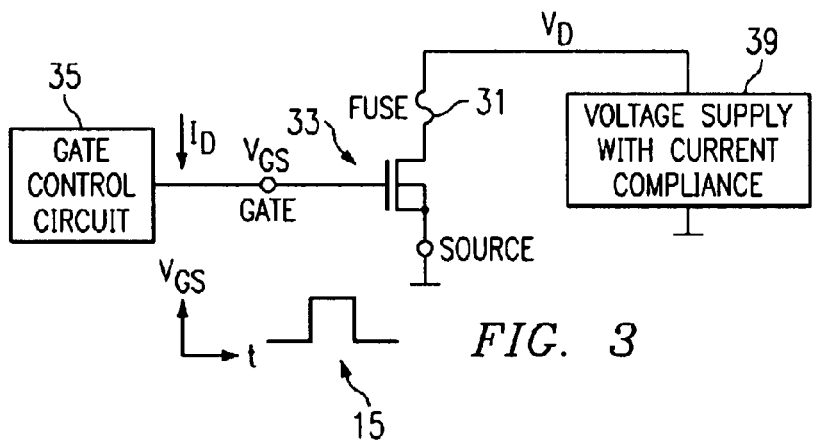
FIG. 3 illustrates a circuit diagram for programming an electrical fuse in accordance with an exemplary embodiment of the present invention.

Referring now to FIG. 3 there is illustrated a fuse programming circuit in accordance with an exemplary embodiment of the present invention in which an electrical fuse 31 is programmed using a transistor 33 (such as a MOSFET) which is operated above its breakdown voltage. For example, the transistor's drain voltage ($V_D$) is driven above its breakdown voltage while the transistor's gate is activated by operation of gate control circuit 35. With the transistor 33 in the breakdown region, a much higher current is enabled than is available from the saturation current, for the same size transistor. Thus, a smaller transistor can be used for programming an electrical fuse.

However, the higher current enabled from breakdown region operation necessitates that consideration be made to prevent damage to the transistor 33 from an excessive current. Cooperative with transistor programming in its breakdown region, a dynamic current compliance device 39 is used to limit the peak current to prevent damage that can result from excessive current flow through the transistor 33. This current limit can be predetermined for the transistor for each application. The current compliance device 39 is coupled in parallel with the series coupled programming transistor 33 and fuse 31. In some embodiments, the current compliance device 39 can be external to a silicon chip on which the fuse 31 and programming transistor 33 are integrated on a silicon chip. The gate control circuit 35 can be external to this silicon chip or included on this silicon chip.

With dynamic current compliance, the circuit is dynamically adjusted to enable maximum current to flow through the circuit without damaging the programming transistor 33. That is, the output current of the current compliance device 39 is not affected by the resistive changes of the fuse 31 typically experienced during programming. Therefore, the current compliance device 39 can supply steady current, behaving as a fixed current source.

Since the supplied current remains constant, the voltage that appears across the fuse/transistor combination is modulated, to a maximum predetermined voltage magnitude of $V_{DD}$, as the resistance of the fuse 31 increases. Also, the compliance device 39 behaves as an ideal voltage supply as long as the current flowing from it does not exceed the compliance current.

Figure 3A:
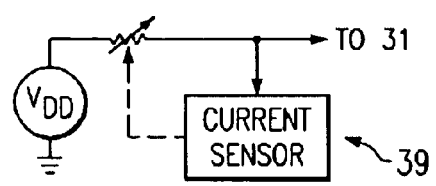
FIG. 3A illustrates exemplary embodiments of the compliance device of FIG. 3.

If conditions tend to increase the current beyond the compliance current threshold (due to load resistance going low), the compliance device 39 behaves as an ideal voltage supply with a series resistance which is dynamically adjusted to maintain the current at the compliance maximum (see exemplary FIG. 3A). In some embodiments, the response time of the dynamic current compliance is an order of magnitude faster than the time taken to program the fuse 31. For example, it should be faster than 100ns for programming some typical polysilicide e-fuses.

Figure 4:
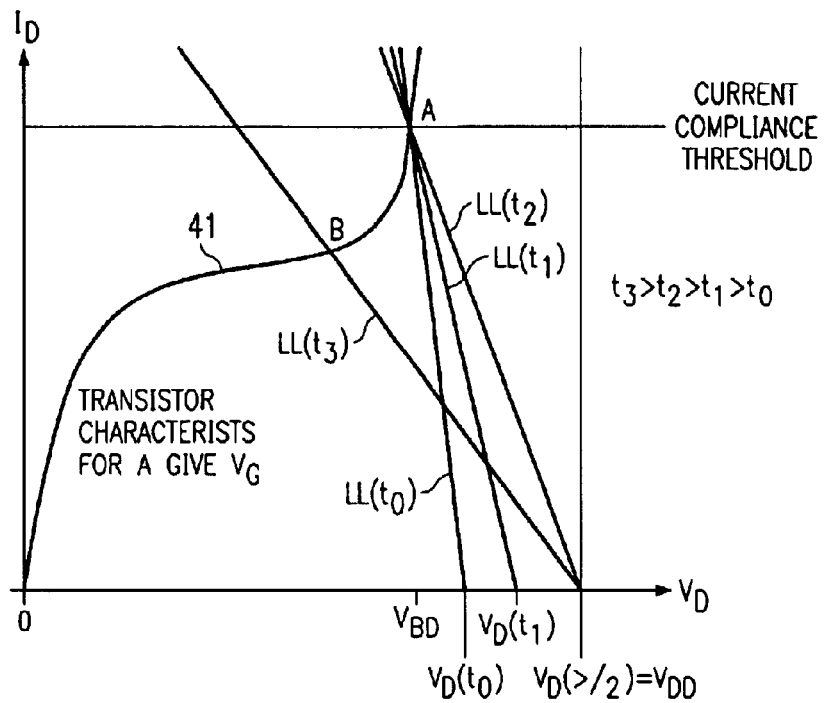
FIG. 4 shows a graphical representation of transistor characteristics and load lines using current compliance in accordance with an exemplary embodiment of the present invention.

Referring now to FIG. 4 there is shown a graphical representation of the $I_D$–$V_D$ characteristics of the fuse load-line during programming of a fuse using the circuit illustrated in FIG. 3. When the gate is turned ON with a given gate voltage $V_G$, the transistor 33 immediately goes into the breakdown mode (where $V_{DD}$ is greater than the breakdown voltage of the programming transistor). An illustrative initial load-line of the fuse 31 is shown as LL($t_0$). In the breakdown region, LL($t_0$) intersects the transistor characteristics curve 41 at the maximum current level allowed by the compliance device 39 at point "A". The voltage supplied by the compliance device 39 is shown as $V_D(t_0)$.

As the current flows through the fuse, it is heated and its resistance correspondingly increases. After some time later noted as $t_1$, the load line may be LL($t_1$) with the compliance device 39 applying an increased voltage of $V_D(t_1)$. At some time $t_2$, the fuse resistance increases until the load line LL($t_2$) passes through $V_{DD}$ and A. At time $t_3$, where $t_3>t_2>t_1$, when the fuse resistance increases further, the load line LL($t_3$) will intersect the transistor characteristics curve 41 at some point "B". As can be seen, for time $t_2$ and earlier, a significantly greater current (i.e. maximum compliance current) flows through the fuse, as compared to the saturation current of the transistor, enabling more effective and/or efficient fuse programming without increasing transistor size or subjecting it to excessive current.

Figure 5:
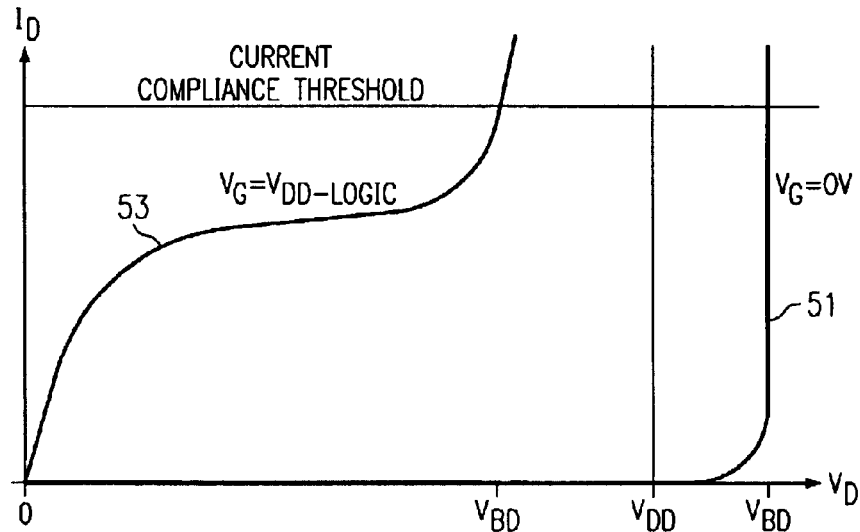
Figure 6:
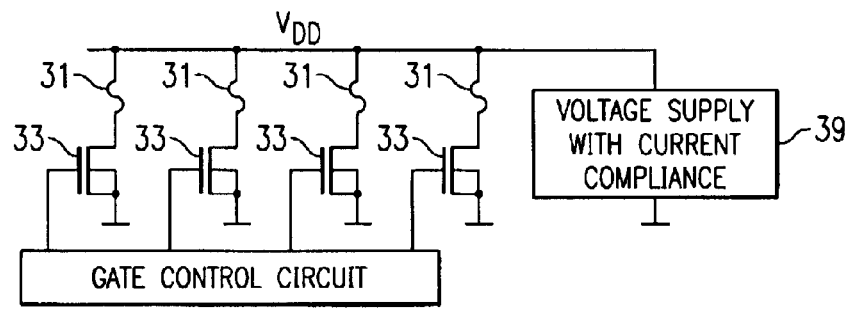
FIG. 6 illustrates a multiple fuse arrangement for programming an electrical fuse in accordance with an exemplary embodiment of the present invention.

The present invention can also be used in multiple fuse arrangements, such as shown in FIG. 6, in which multiple transistor/fuse circuits (i.e. serially connected transistor 33 and fuse 31) are coupled in parallel with the compliance device 39. Referring now to FIG. 5 there is shown the $I_D$–$V_D$ characteristics of a typical n-channel MOSFET to illustrate operation of a multiple fuse embodiment of the present invention. It should be understood that other transistors types can be used in a similar manner.

As shown by $I_D$–$V_D$ characteristic curves 51 and 53, the breakdown voltage $V_{BD}$ of the transistor 33 with a gate voltage $V_G=0$ is larger than the $V_{BD}$ of the transistor with a gate voltage $V_G>0$. By appropriate selection of the transistor 33 and fuse 31, the programming voltage ($V_{DD}$) of a fuse can be advantageously located between these two breakdown voltages. Thus, a fuse can be selected for programming by a coupled transistor operating in the breakdown region without effecting a current flow in the other unselected fuses.

In this embodiment, a voltage is applied (by a suitable gate control circuit) to the gate of the programming transistor associated with the selected fuse and no voltage is applied to the other transistor gates. Because the power supply is greater than the breakdown voltage of any transistor with a biased gate, the selected transistor goes into breakdown and the corresponding current flow through the transistor increases to the current compliance threshold. No current passes through the unselected fuses since the power supply is less than the breakdown voltage of the transistors with no bias applied to the gate.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A method of programming an integrated electric fuse via a series coupled transistor having a drain, source and gate, wherein said fuse is coupled to one of said drain and source, said method comprising:

applying a signal to said transistor gate of sufficient magnitude to activate said transistor for commencing a programming period;

during said programming period, producing in said fuse a current of sufficient magnitude to produce an increase in electrical resistance in said fuse, including operating said transistor in its breakdown region;

providing a voltage to said transistor such that the magnitude of said voltage is greater than the breakdown voltage of said transistor for operating said transistor in its breakdown region; and limiting said current to a magnitude that has been determined to be insufficient to damage said transistor, including dynamically varying said voltage relative to the increase in electrical resistance of said fuse during said programming period such that said current is maintained at a fixed magnitude.

2. A method of programming an integrated electric fuse via a series coupled transistor having a drain, source and gate, wherein said fuse is coupled to one of said drain and source, said method comprising:

producing in said fuse a current of sufficient magnitude to produce an increase in electrical resistance in said fuse, including operating said transistor in its breakdown region;

limiting said current to a magnitude that has been determined to be insufficient to damage said transistor; and selecting said fuse from a plurality of available fuses coupled at a common node for producing said current in said fuse, and activating the gate of the series coupled transistor associated with said fuse, said selecting step including providing a predetermined voltage to said common node such that the magnitude of said predetermined voltage is greater than the breakdown voltage of the transistors in an activated mode and less than the breakdown voltage of the transistors in an inactivated mode.

3. The method of claim 2, wherein said limiting step includes modulating said predetermined voltage relative to the increase in electrical resistance of said fuse during programming such that said current is maintained at a fixed magnitude.

4. A programmable fuse apparatus, comprising:

a programmable fuse structure including a fuse and a transistor having a gate and drain and source, said transistor coupled to said fuse such that said drain and said source are selectively connectable in series with said fuse; and a programming device coupled to said fuse structure and cooperable with said transistor for, during a programming period, producing in said fuse a current of sufficient magnitude to produce an increase in electrical resistance in said fuse, said programming device adapted to operate said transistor in its breakdown region and limit said current to a magnitude that has been determined to be insufficient to damage said transistor, said programming device including a compliance device coupled to said fuse structure and adapted to provide a voltage greater than the breakdown voltage of said transistor for driving said transistor to its breakdown region, said compliance device further adapted to provide said current responsive to activation of said transistor gate, said compliance device further adapted to dynamically vary said voltage relative to the increase in electrical resistance of said fuse during said programming period such that said current is maintained at a fixed magnitude.

5. A programmable fuse apparatus, comprising:

a programmable fuse structure including a fuse and a transistor having a gate and drain and source, said transistor coupled to said fuse such that said drain and said source are selectively connectable in series with said fuse; and a programming device coupled to said fuse structure and cooperable with said transistor for producing in said fuse a current of sufficient magnitude to produce an increase in electrical resistance in said fuse, said programming device adapted to operate said transistor in its breakdown region and limit said current to a magnitude that has been determined to be insufficient to damage said transistor, said programming device including a compliance device coupled to said fuse structure and adapted to provide a voltage greater than the breakdown voltage of said transistor for driving said transistor to its breakdown region, wherein said fuse structure is integrated on a silicon chip and said compliance device is external to the silicon chip.

6. An electrical programming system, comprising:

a plurality of programmable fuse structures coupled at a common node and each including a fuse and a transistor having a gate and drain and source, said transistor coupled to said fuse such that said drain and said source are connectable in series with said fuse; and a programming device coupled to each of said fuse structures and adapted to effectuate a current of sufficient magnitude to produce an increase in electrical resistance selectively to the fuse of one of said fuse structures, said programming device further adapted to operate said transistors in their breakdown region and limit said current to a magnitude that has been determined to be insufficient to damage said transistors, said programming device further including a compliance device coupled to said common node and adapted to provide a predetermined voltage with a magnitude greater than the breakdown voltage of the transistors in an activated mode and less than the breakdown voltage of the transistors in an inactivated mode.

7. The system of claim 6, wherein said compliance device is further adapted to modulate said predetermined voltage relative to the increase in electrical resistance of the fuse during programming such that said current is maintained at a fixed magnitude.

8. The method of claim 2 further including performing said producing step during a programming period, and applying a signal to said transistor gate of sufficient magnitude to activate said transistor for commencing the programming period.

9. The method of claim 8 further including providing a voltage to said transistor such that the magnitude of said voltage is greater than the breakdown voltage of said transistors for operating said transistor in its breakdown region.

10. The method of claim 1, further including selecting said fuse from a plurality of available fuses coupled at a common node for producing said current in said fuse, and activating the gate of the series coupled transistor associated with said fuse.

11. The apparatus of claim 5, wherein said programming device includes a control circuit coupled to said gate and adapted to provide a signal of sufficient magnitude to activate said gate for commencing a programming period.

12. The apparatus of claim 5, wherein said compliance device is further adapted to provide said current responsive to activation of said transistor gate.

13. The apparatus of claim 4, wherein the response time of said compliance device is at least an order of magnitude faster than said programming period.

14. The apparatus of claim 5, wherein said fuse structure and at least a portion of said programming device are integrated on a silicon chip.

15. The system of claim 6, wherein said programming device includes a control circuit coupled to said gates and adapted to effectuate selection of the fuse, said control circuit further adapted to provide a signal of sufficient magnitude to activate the gate of the transistor associated with the fuse for commencing a programming period.

16. The system of claim 6, wherein said fuse structures and at least a portion of said programming device are integrated on a silicon chip.

* * * * *